(12) United States Patent
Ferguson

(10) Patent No.: US 7,272,804 B2
(45) Date of Patent: Sep. 18, 2007

(54) GENERATION OF RTL TO CARRY OUT PARALLEL ARITHMETIC OPERATIONS

(75) Inventor: Jonathan L. Ferguson, Bristol (GB)

(73) Assignee: Broadcom Corporation, Irvine, CA (US)

( * ) Notice: Subject to any disclaimer, the term of this patent is extended or adjusted under 35 U.S.C. 154(b) by 102 days.

(21) Appl. No.: 11/190,879

(22) Filed: Jul. 28, 2005

(65) Prior Publication Data

US 2006/0095486 A1     May 4, 2006

Related U.S. Application Data

(60) Provisional application No. 60/618,233, filed on Oct. 14, 2004.

(51) Int. Cl.
*G06F 17/50*     (2006.01)
(52) U.S. Cl. .............................. 716/2; 716/12; 716/17; 716/18
(58) Field of Classification Search .................... 716/2, 716/12, 17, 18
See application file for complete search history.

(56) References Cited

U.S. PATENT DOCUMENTS

| | | |
|---|---|---|
| 5,390,135 A | 2/1995 | Lee et al. |
| 5,943,251 A | 8/1999 | Jiang et al. |
| 6,044,392 A * | 3/2000 | Anderson et al. ........... 708/551 |
| 2004/0006584 A1* | 1/2004 | Vandeweerd ................ 709/107 |

OTHER PUBLICATIONS

European Search Report issued Aug. 10, 2005 for Appl. No. EP 02257666,2 pages.
Inoue, Toshiaki et al., "An Area-Effective Datapath Architecture for Embedded Microprocessors and Scalable Systems", IEICE Transactions on Electronics; vol. E84-C, No. 8, Aug. 2001, (2001), pp. 1014-1020.

* cited by examiner

*Primary Examiner*—Thuan Do
(74) *Attorney, Agent, or Firm*—Sterne, Kessler, Goldstein & Fox PLLC

(57) ABSTRACT

Computer-implemented method and system for generating an optimized description of an arithmetic function comprising at least two of an addition, a multiplication, and a rounding operation to be carried out on a plurality of data bits in a plurality of registers of an electronic circuit, the method comprising the steps: obtaining a first description of the arithmetic function; decomposing the first description to obtain a second description comprising individual binary and logical operations on data bits, wherein the data bits are arranged to their proper place value, the second description being substantially arithmetically equivalent to the first description; obtaining a third description by parallelizing at least two of the binary and logical operations on the data bits in the second description; providing a forth description comprising operations for each data bit comprised in the third description in a hardware description language as the optimized description of the electronic circuit.

15 Claims, 3 Drawing Sheets

GENERATION OF RTL TO CARRY OUT PARALLEL ARITHMETIC OPERATIONS

CROSS-REFERENCE TO RELATED APPLICATION

This application claims benefit to U.S. Provisional Application No. 60/618,233, filed Oct. 14, 2004, entitled "Generation of RTL to Carry Out Parallel Arithmetic Operations", which is incorporated herein by reference in its entirety.

FIELD OF THE INVENTION

The present invention relates to electronic integrated circuit design, and more specifically to a method and system for generating register transfer level operations to carry out high level arithmetic functions comprising parallel arithmetic operations.

BACKGROUND ART

Due to their increased integration density and functionality, the design of electronic integrated circuits has become ever more complex.

The complexity of the electronic integrated circuits requires particular strategies in the design cycle. Conventional strategies are "top down", "bottom up", or similarly structured approaches.

In a top down approach for instance, the design of a particular integrated circuit starts at a relatively high level of abstraction, and thereafter the relevant design is progressively refined at increasingly lower levels of abstraction, by starting at a "systems level", proceeding via an "algorithm register transfer and/or logic level" to a "circuit level" etc., until finally the mask data required for manufacturing the components is obtained.

A register transfer level (RTL) description is a description of an electronic circuit determining the data flow between registers, which store information between clock cycles in an electronic circuit. An RTL description determines where this information is stored, what it represents, and how it is passed through the circuit during its operation. Thus, an RTL description determines how data is transformed as it is passed from register to register.

On a logical level, the logical circuits are designed using simulation systems or synthesis tools wherein a circuit design is expressed in a proprietary language or hardware description language (HDL) such as RTL (register transfer level). An example for a hardware description language is Verilog as described by IEEE Standard 1364.1, "Standard for Verilog Register Transfer Level Synthesis" and an example for a simulation system or synthesis tools is NCVerilog available from Cadence, 2655 Scely Avenue, San José, Calif. 95134.

By using a hardware description language such as RTL a synthesis tool may be used to express a particular electronic circuit design. Once expressed in RTL the electronic circuit design may be altered and/or refined in order to optimize it according to predetermined design criteria.

The place value of a binary digit (bit) in a binary number expresses the binary power represented by the bit to constitute the binary number.

While serial arithmetical or logical operations are carried out in consecutive steps according to a given design of an electronic circuit, and controlled by the clock cycles generated in the electronic circuit, parallel arithmetic or logical operations are executed concurrently with one clock cycle.

Relying on synthesis tools to optimize an electronic circuit design is cumbersome, time consuming and may be error prone.

Therefore, it is an object of the present invention to provide a method and system to optimize the design of electronic circuit designs to comprising parallel arithmetic operations.

SUMMARY OF THE INVENTION

The present invention comprises a computer-implemented method, a computer-readable storage medium, and a system, e.g., for generating an optimized description of an arithmetic function, substantially as shown in and/or described in connection with at least one of the figures, as set forth more completely in the claims.

BRIEF DESCRIPTION OF THE DRAWINGS

The accompanying drawings, which are incorporated in and constitute a part of the specification, illustrate an embodiment of the invention and, together with the description, explain the purpose, advantages, and principles of the invention.

DETAILED DESCRIPTION OF THE INVENTION

Figure 1:
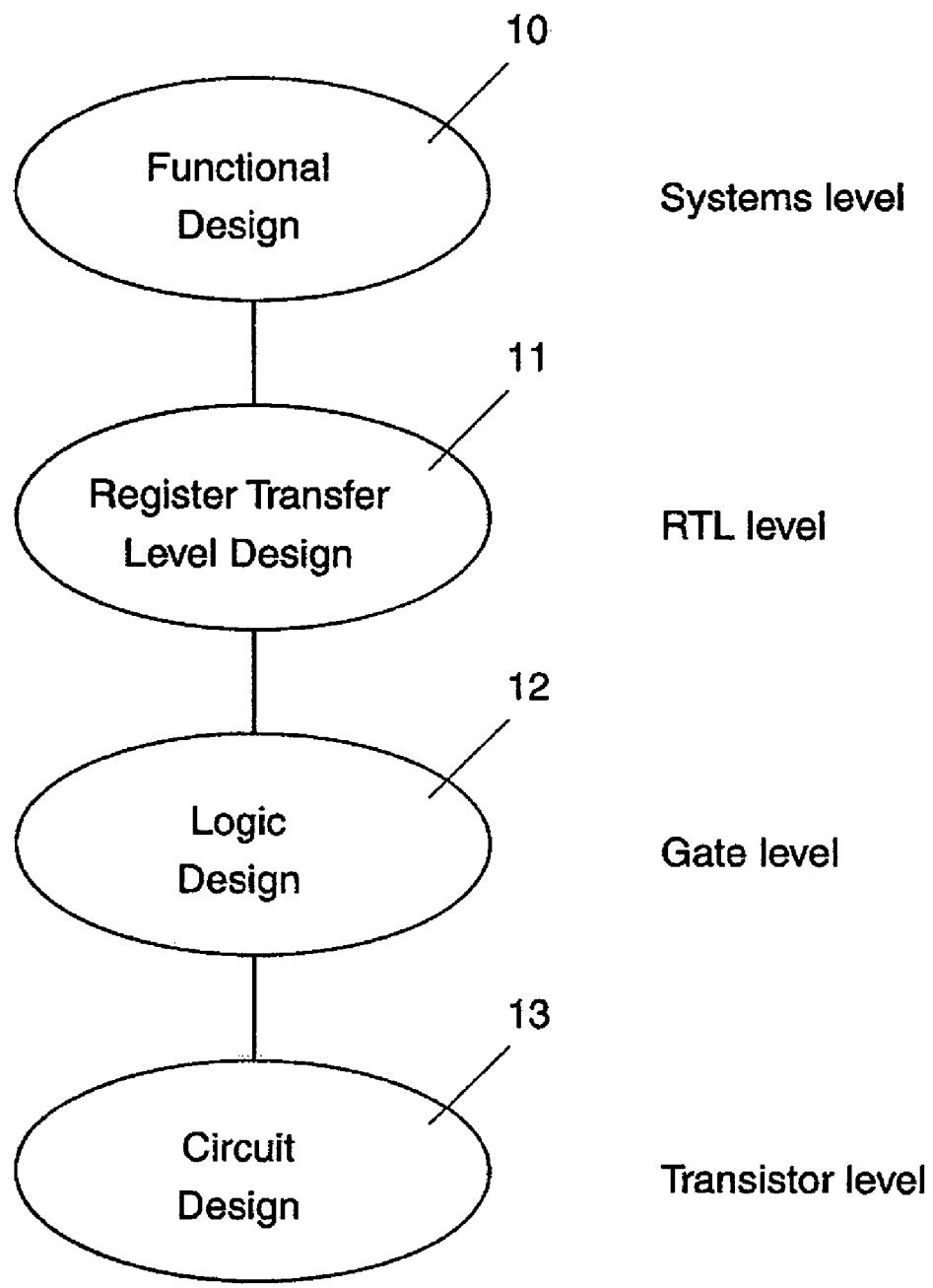
FIG. 1 shows a diagram explaining the top down approach for circuit design.

According to a first aspect the aforementioned object is achieved by a computer-implemented method for generating an optimized description of an arithmetic function comprising at least two of an addition, a multiplication, and a rounding operation to be carried out on a plurality of data bits in a plurality of registers of an electronic circuit, the method comprising the steps: obtaining a first description of the arithmetic function; decomposing the first description to obtain a second description comprising individual binary and logical operations on data bits, wherein the data bits are arranged to their proper place value, the second description being substantially arithmetically equivalent to the first description; obtaining a third description by parallelizing at least two of the binary and logical operations on the data bits in the second description; providing a forth description comprising operations for each data bit comprised in the third description in a hardware description language as the optimized description of the electronic circuit.

The method according to the invention may further comprise the intermediate step of assessing the arithmetic equivalence of the first and second description.

In the method according to the invention the parallelizing may be carried out whereby the length of at least one carry chain in the second description is reduced.

In the method according to the invention the parallelizing may be based on the combination of serial binary and/or logical operations.

In the method according to the invention the combination of operations may comprise their concurrent execution by means of the electronic circuit.

In the method according to the invention at least one of the first, second or third description may be a description in a hardware description language.

In the method according to the invention the hardware description language may be in an RTL language or alternatively in Broadcom ASIC library code.

The method of the present invention may be implemented in a computer program written in a high level programming language such as C or C++.

In an other embodiment of the present invention a computer-readable storage medium is provided comprising program code for performing the methods described above, when loaded into a computer system.

In yet another embodiment of the invention a computer system is provided for generating an optimized description of an arithmetic function comprising at least two of an addition, a multiplication, and a rounding operation to be carried out on a plurality of data bits in a plurality of registers of an electronic circuit, the system suitably programmed for the following steps: obtaining a first description of the arithmetic function; decomposing the first description to obtain a second description comprising individual binary and logical operations on data bits, wherein the data bits are arranged to their proper place value, the second description being substantially arithmetically equivalent to the first description; obtaining a third description by parallelizing at least two of the binary and logical operations on the data bits in the second description; providing a forth description comprising operations for each data bit comprised in the third description in a hardware description language as the optimized description of the electronic circuit.

The system according to the invention may further be suitably programmed to perform the intermediate step of assessing the arithmetic equivalence of the first and second description.

The system according to the invention may be suitable for parallelizing whereby the length of at least one carry chain in the second description can be reduced.

In the system according to the invention parallelizing may be based on the combination of serial binary and/or logical operations.

In the system according to the invention the combination of operations may comprise their concurrent execution by means of the electronic circuit.

In the system according to the invention at least one of the first, second or third description may be a description in a hardware description language.

In the system according to the invention the hardware description language may be in an RTL language or alternatively in Broadcom ASIC library code.

Further embodiments, features and advantages of the present invention, as well as the structure and operation of the various embodiments of the present invention, are described in detail below with reference to the accompanying drawings.

The following more detailed description of the present invention refers to the accompanying drawings that illustrate exemplary embodiments consistent with this invention. Other embodiments are possible, and modifications may be made to the embodiments within the spirit and scope of the present invention. Therefore, the following detailed description is not meant to limit the invention. Rather, the scope of the invention is defined by the appended claims.

It would be apparent to one of skill in the art that the present invention, as described below, may be implemented in many different embodiments of hardware, software and/or, firmware. Any actual software code with specialized control hardware to implement the present invention is not limiting of the present invention. Thus, the operation and behavior of the present invention will be described with the understanding that modifications and variations of the embodiments are possible, given the level of detail presented herein.

High level arithmetic functions may include additions, multiplications and rounding as well as saturation, clipping, and truncation.

FIG. 1 shows successive levels of the top-down approach for circuit design starting with the functional design at the systems level 10, proceeding to register transfer level design 11, the so called RTL level, progressing to the logic design 12 at gate level, down to the circuit design 13 at transistor level.

Figure 2:
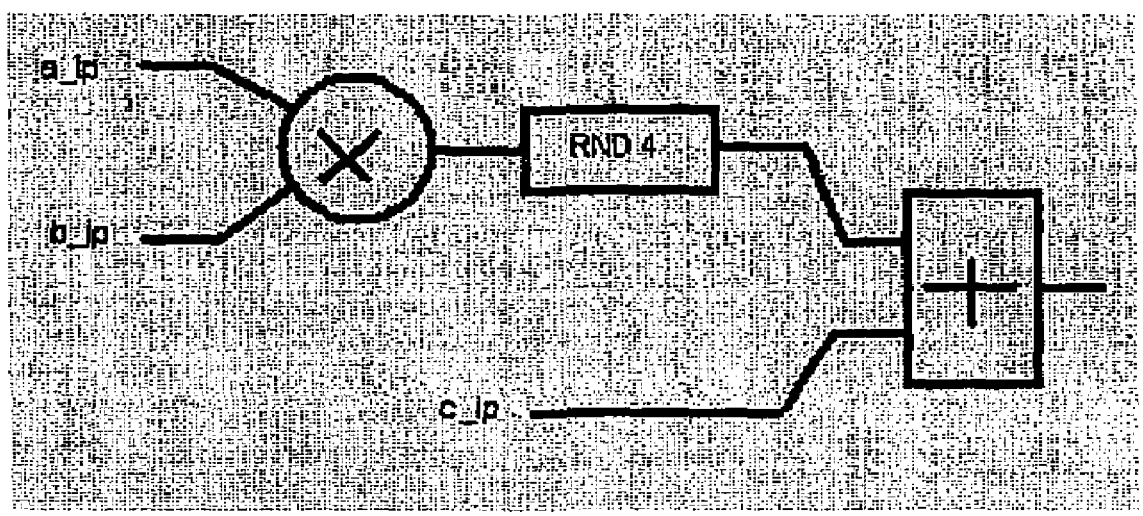
FIG. 2 shows a flow chart comprising steps carried out by a preferred embodiment of the present invention.

The flow chart of FIG. 2 shows the principle steps carried out by the method of the present invention.

There is a need to optimize electronic circuit designs of high level arithmetic functions, and particularly to optimize the design of electronic circuit designs of high level arithmetic functions comprising parallel arithmetic operations.

Step 410 obtains a first description of an arithmetic function, step 420 decomposes the first description to obtain the second description, substantially arithmetically equivalent to the first description, comprising individual binary and logical operations on data bits in their proper place value, step 430 obtains a third description by parallelizing at least two of the binary and logical operations on the data bits in the second description, step 440 provides a forth description comprising operations for each data bit comprised in third description in a hardware description language.

Starting from a high level arithmetic function described in a proprietary RTL language preferred embodiment of the present invention parses the RTL description in order to define how data is processed as it is transferred or carried from register to register.

Table 1 shows an example of a high-level arithmetic function expressed in the RTL language.

Figure 3:
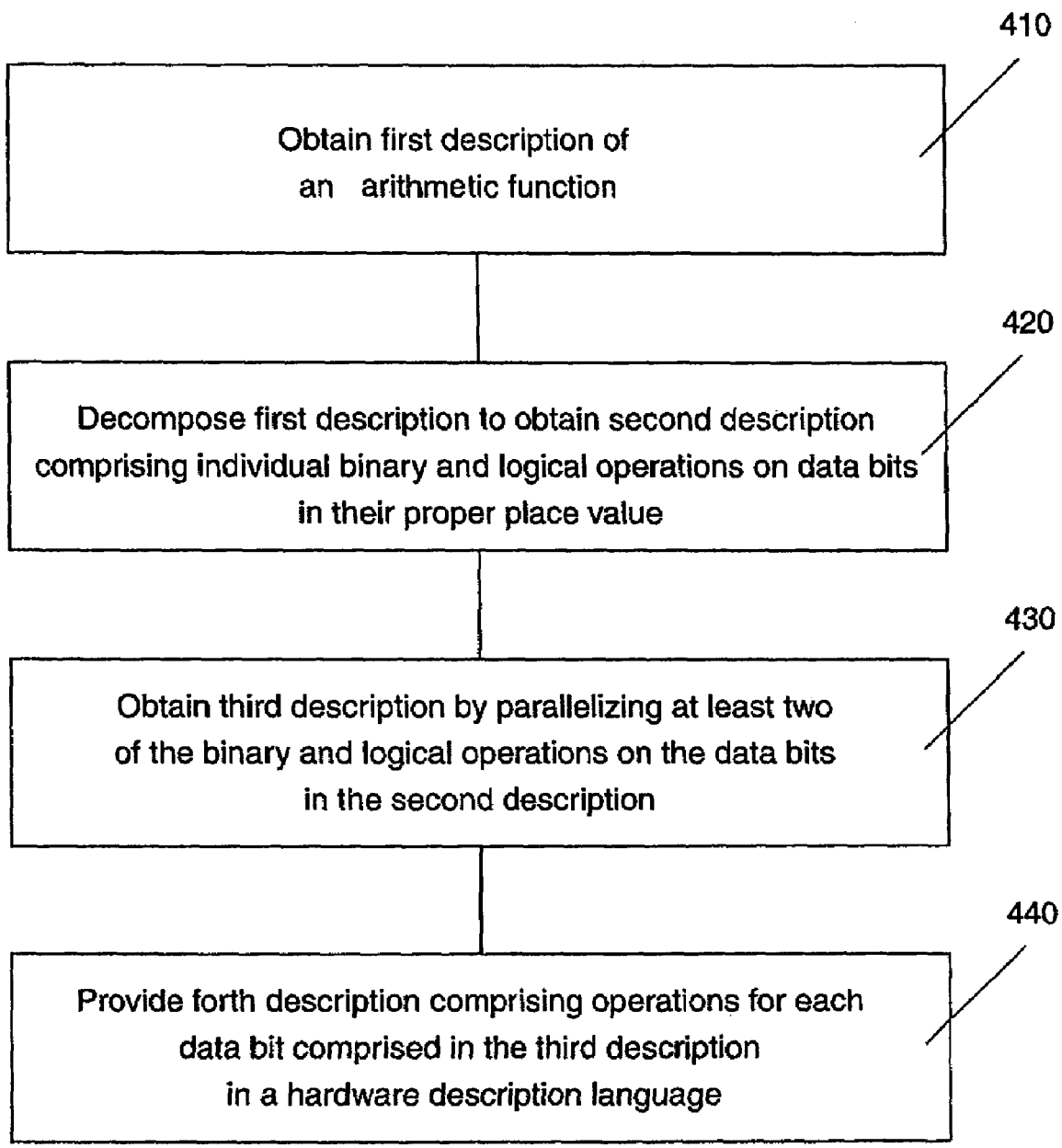
FIG. 3 graphically depicts arithmetic operations of an RTL description.

TABLE 1 prefix arith0;
in signed a_ip[4];
in signed b_ip[4];
in signed c_ip[4];
pout outp = rnd((a_ip * b_ip),4) + c_ip;

FIG. 3 graphically depicts the arithmetic operations as expressed in the RTL description of table 1.

The operations of FIG. 3 are described from right to left: a signed 4 bit-wide number input at c_ip is added to the rounded result of a multiplication of two signed 4 bit-wide numbers input at a_ip and b_ip, respectively.

The number of carry chains in an electronic circuit design contributes to the area of an electronic circuit and can increase the length of the critical-timing arc of the resulting mask data, and thus contributes to the efficiency of the resulting electronic circuit.

The method of the present invention optimizes and/or rearranges the registers and/or the register transfers in the parsed description of a high level arithmetic function in order to reduce or minimize the number of carry chains.

Table 2 shows the result of an optimization according to the invention of the arithmetic function described in RTL and table 1. The optimized result is again expressed in RTL language.

Low level modules are not included in the RTL description of table 2.

TABLE 2

```
module arith0_ss_4x4r4_s_a4_m(
c_ip,
a_ip,
b_ip,
outp1_op,
outp0_op);
input [3:0] a_ip;
input [3:0] b_ip;
input [3:0] c_ip;
output [7:0] outp1_op;
output [7:0] outp0_op;
//Wire Declarations
    wire net56_w;
    wire net55_w;
    . . .
    wire net1_w;
    wire net0_w;
//Input assignments
assign net12_w = b_ip[3];
assign net11_w = b_ip[2];
assign net10_w = b_ip[1];
assign net9_w = b_ip[0];
assign net8_w = a_ip[3];
assign net7_w = a_ip[2];
assign net6_w = a_ip[1];
assign net5_w = a_ip[0];
assign net3_w = c_ip[3];
assign net2_w = c_ip[2];
assign net1_w = c_ip[1];
assign net0_w = c_ip[0];
//Instances
xor2_m G20_u(.a_ip(net25_w),.b_ip(net37_w),.q_op(net56_w));
hadd_m G19_u(.a_ip(net33_w),.b_ip(net24_w),.s_op(net54_w),
.co_op(net55_w));
hadd_m G18_u(.a_ip(net23_w),.b_ip(net36_w),.s_op(net52_w),
.co_op(net53_w));
fadd_m G17_u(.a_ip(net19_w),.b_ip(net47_w),.c_ip(net35_w),
.s_op(net50_w),.co_op(net51_w));
fadd_m G16_u(.a_ip(net22_w),.b_ip(net46_w),.c_ip(net34_w),
.s_op(net48_w),.co_op(net49_w));
ifadd_m G15_u(.a_ip(net4_w),.b_ip(net43_w),.s_op(net46_w),
.co_op(net47_w));
fadd_m G14_u(.a_ip(net29_w),.b_ip(net42_w),.c_ip(net21_w),
.s_op(net44_w),.co_op(net45_w));
hadd_m G13_u(.a_ip(net2_w),.b_ip(net30_w),.s_op(net42_w),
.co_op(net43_w));
hadd_m G12_u(.a_ip(net1_w),.b_ip(net20_w),.s_op(net40_w),
.co_op(net41_w));
fadd_m G11_u(.a_ip(net0_w),.b_ip(net17_w),.c_ip(net16_w),
.s_op(net38_w),.co_op(net39_w));
sextn_m G10_u(.Yn_ip(net12_w),.X2_ip(net28_w),
.Pz_ip(net31_w),.Nz_ip(net32_w),.sext_op(net37_w));
ppgen_m
G9_u(.Y0_ip(net11_w),.Y1_ip(net12_w),.X1_b_ip(net26_w),
.X2_b_ip(net27_w),.neg_ip(net28_w),.ppg_op(net36_w));
ppgen_m
G8_u(.Y0_ip(net10_w),.Y1_ip(net11_w),.X1_b_ip(net26_w),
.X2_b_ip(net27_w),.neg_ip(net28_w),.ppg_op(net35_w));
ppgen_m
G7_u(.Y0_ip(net9_w),.Y1_ip(net10_w),.X1_b_ip(net26_w),
.X2_b_ip(net27_w),.neg_ip(net28_w),.ppg_op(net34_w));
boothN_m
G6_u(.X0_ip(net6_w),.X1_ip(net7_w),.X2_ip(net8_w),
.Y0_ip(net9_w),.Yn_ip(net12_w),.X1_b_op(net26_w),
.X2_b_op(net27_w),.neg_op(net28_w),.lsb_op(net29_w),
.neg_cin_op(net30_w),.Pz_op(net31_w),.Nz_op(net32_w),
.msb_op(net33_w));
sext0_m
G5_u(.Yn_ip(net12_w),.X2_ip(net15_w),.Pz_ip(net18_w),
.sext0_op(net23_w),.sext1_op(net24_w),.sext2_op(net25_w));
ppgen_m
G4_u(.Y0_ip(net11_w),.Y1_ip(net12_w),.X1_b_ip(net13_w),
.X2_b_ip(net14_w),.neg_ip(net15_w),.ppg_op(net22_w));
ppgen_m
G3_u(.Y0_ip(net10_w),.Y1_ip(net11_w),.X1_b_ip(net13_w),
.X2_b_ip(net14_w),.neg_ip(net15_w),.ppg_op(net21_w));
ppgen_m
G2_u(.Y0_ip(net9_w),.Y1_ip(net10_w),.X1_b_ip(net13_w),
.X2_b_ip(net14_w),.neg_ip(net15_w),.ppg_op(net20_w));
```

TABLE 2-continued

```
booth0_m
G1_u(.X0_ip(net5_w),.X1_ip(net6_w),.Y0_ip(net9_w),
.Yn_ip(net12_w),.X1_b_op(net13_w),.X2_b_op(net14_w),
.neg_op(net15_w),.lsb_op(net16_w),.neg_cin_op(net17_w),
.Pz_op(net18_w),.msb_op(net19_w));
inv_m G0_u(.a_ip(net3_w),.q_op(net4_w));
//Output assignments
assign outp0_op[0] = 1'b0;
assign outp0_op[1] = net39_w;
assign outp0_op[2] = net41_w;
assign outp0_op[3] = net45_w;
assign outp0_op[4] = net49_w;
assign outp0_op[5] = net51_w;
assign outp0_op[6] = net53_w;
assign outp0_op[7] = net55_w;
assign outp1_op[0] = net38_w;
assign outp1_op[1] = net40_w;
assign outp1_op[2] = net44_w;
assign outp1_op[3] = net48_w;
assign outp1_op[4] = net50_w;
assign outp1_op[5] = net52_w;
assign outp1_op[6] = net54_w;
assign outp1_op[7] = net56_w;
endmodule
```

The foregoing description of the preferred embodiments provides an illustration and description, but is not intended to be exhaustive or to limit the invention to the precise form disclosed. Modifications and variations are possible consistent with the above teachings, or may be acquired from practice of the invention.

What is claimed is:

1. Computer-implemented method for generating an optimized description of an arithmetic function comprising at least two of an addition, a multiplication, and a rounding operation to be carried out on a plurality of data bits in a plurality of registers of an electronic circuit, the method comprising the steps:
   obtaining a first description of the arithmetic function;
   decomposing the first description to obtain a second description comprising individual binary and logical operations on data bits, wherein the data bits are arranged to their proper place value, the second description being substantially arithmetically equivalent to the first description;
   obtaining a third description by parallelizing at least two of the binary and logical operations on the data bits in the second description;
   providing a forth description comprising operations for each data bit comprised in the third description in a hardware description language as the optimized description of the electronic circuit.

2. The method of claim 1, further comprising the intermediate step of assessing the arithmetic equivalence of the first and second description.

3. The method of claim 1, wherein the parallelizing is carried out whereby the length of at least one carry chain in the second description is reduced.

4. The method of claim 3, wherein the parallelizing is based on the combination of serial binary and/or logical operations.

5. The method of claim 4, wherein the combination of operations comprises their concurrent execution by means of the electronic circuit.

6. The method of claim 5, wherein at least one of the first, second or third description is a description in a hardware description language.

7. The method of claim 6, wherein the hardware description language is RTL.

8. Computer-readable storage medium comprising program code for performing the method according to claim 1, when loaded into a computer system.

9. Computer system for generating an optimized description of an arithmetic function comprising at least two of an addition, a multiplication, and a rounding operation to be carried out on a plurality of data bits in a plurality of registers of an electronic circuit, the system suitably programmed for the following steps:

obtaining a first description of the arithmetic function;

decomposing the first description to obtain a second description comprising individual binary and logical operations on data bits, wherein the data bits are arranged to their proper place value, the second description being substantially arithmetically equivalent to the first description;

obtaining a third description by parallelizing at least two of the binary and logical operations on the data bits in the second description;

providing a forth description comprising operations for each data bit comprised in the third description in a hardware description language as the optimized description of the electronic circuit.

10. The system of claim 9, further suitably programmed to perform the intermediate step of assessing the arithmetic equivalence of the first and second description.

11. The system of claim 9, suitable for parallelizing whereby the length of at least one carry chain in the second description can be reduced.

12. The system claim 11, wherein the parallelizing is based on the combination of serial binary and/or logical operations.

13. The system of claim 12, wherein the combination of operations comprises their concurrent execution by means of the electronic circuit.

14. The system of claim 13, wherein at least one of the first, second or third description is a description in a hardware description language.

15. The system of claim 14, wherein the hardware description language is RTL.

* * * * *